(12) United States Patent
Baze

(10) Patent No.: US 6,278,287 B1
(45) Date of Patent: Aug. 21, 2001

(54) ISOLATED WELL TRANSISTOR STRUCTURE FOR MITIGATION OF SINGLE EVENT UPSETS

(75) Inventor: Mark P. Baze, Kingston, WA (US)

(73) Assignee: The Boeing Company, Seattle, WA (US)

( * ) Notice: Subject to any disclaimer, the term of this patent is extended or adjusted under 35 U.S.C. 154(b) by 0 days.

(21) Appl. No.: 09/428,239

(22) Filed: Oct. 27, 1999

(51) Int. Cl.[7] ................. H03K 19/003; H01L 29/76; G11C 11/34
(52) U.S. Cl. ................. 326/9; 326/13; 326/27; 257/369; 257/371; 365/72; 365/176; 365/181
(58) Field of Search .................. 326/9, 13, 27; 257/369, 371, 379, 380; 365/72, 156, 181, 190, 53

(56) References Cited

U.S. PATENT DOCUMENTS

| | | | |
|---|---|---|---|
| 4,785,200 | 11/1988 | Huntington | 207/279 |
| 4,914,629 | 4/1990 | Blake et al. | 365/154 |
| 4,931,990 | 6/1990 | Perkin | 365/1 |
| 5,111,429 | 5/1992 | Whitaker | 365/156 |
| 5,175,605 | 12/1992 | Pavlu et al. | 257/369 |
| 5,192,920 | * 3/1993 | Netson et al. | 330/277 |
| 5,307,142 | 4/1994 | Corbett et al. | 365/156 |
| 5,406,513 | 4/1995 | Canaris et al. | 365/181 |
| 5,418,473 | * 5/1995 | Canaris | 326/27 |
| 5,504,703 | 4/1996 | Bansal | 365/156 |
| 5,525,923 | 6/1996 | Bialas, Jr. et al. | 327/210 |
| 5,631,863 | * 5/1997 | Fechner et al. | 365/156 |
| 5,672,918 | 9/1997 | Kimbrough et al. | 307/126 |
| 5,870,332 | 2/1999 | Lahey et al. | 365/156 |
| 5,905,290 | * 5/1999 | Houston | 257/380 |
| 6,111,780 | * 8/2000 | Bertin | 365/154 |

* cited by examiner

*Primary Examiner*—Michael Tokar
*Assistant Examiner*—Vibol Tan
(74) *Attorney, Agent, or Firm*—Conrad O. Gardner

(57) ABSTRACT

CMOS circuits are made resistant to erroneous signals produced by the impact of high energy charged particles (commonly known in the literature as Single Event Upset or SEU) by the addition of upset immune transistor structures into the circuits in such a way that they block and dissipate the erroneous signal. The added transistor structures are made immune to SEU by placing them in well diffusions that are separate from the rest of the circuit and biasing those wells such that the electric fields surrounding the transistors are very low in comparison to the rest of the circuit. Signal blocking is achieved with an SEU immune transistor that is in an "off" state whenever other circuit transistors that deliver signals through it are potentially sensitive to SEU. Dissipation is achieved with either a resistor or low current drive transistor that spreads the SEU signal out over time thereby reducing its voltage change to an acceptable level.

7 Claims, 8 Drawing Sheets

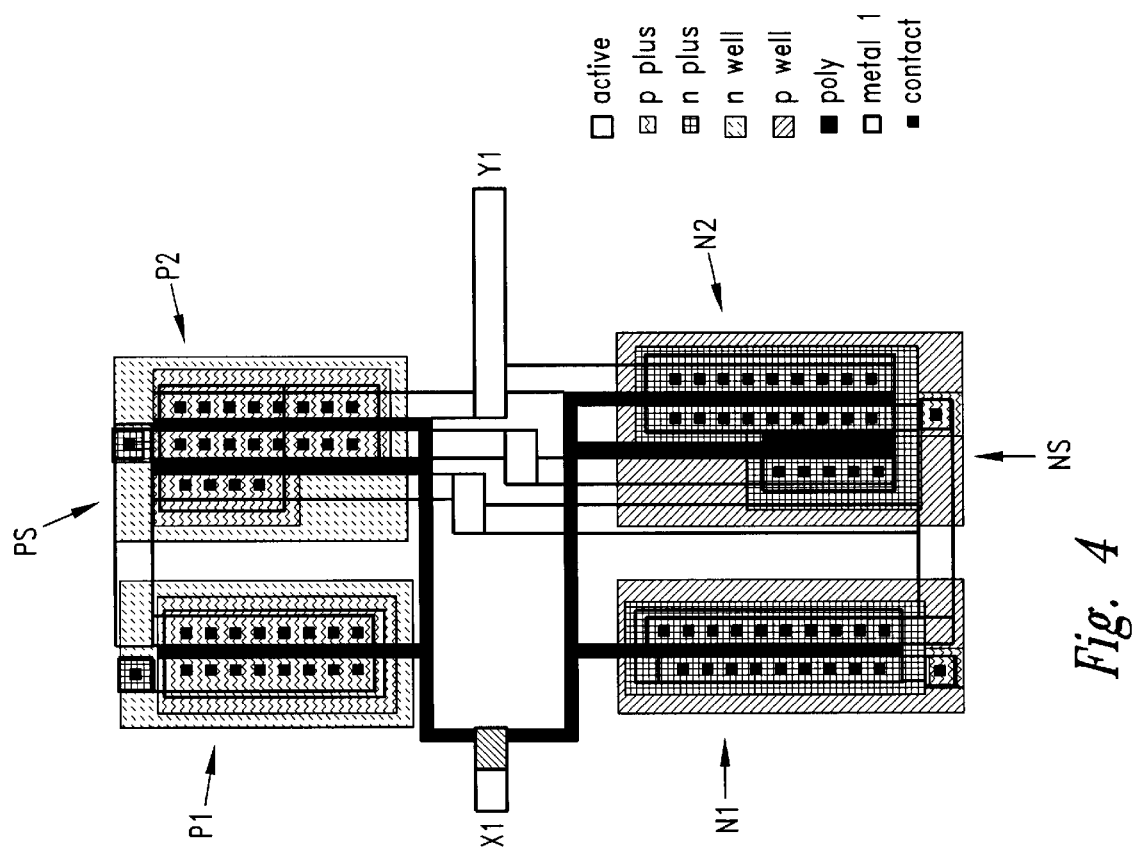
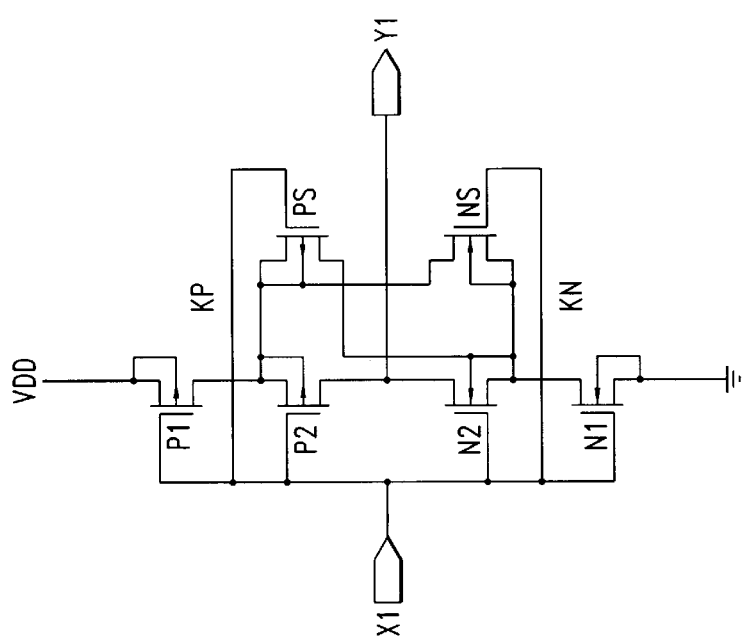
Fig. 4
Fig. 3

ISOLATED WELL TRANSISTOR STRUCTURE FOR MITIGATION OF SINGLE EVENT UPSETS

FIELD OF THE INVENTION

This invention relates to both analog and digital CMOS circuits and provides a design architecture, which can be utilized to improve the single event upset hardness of any CMOS circuit design.

BACKGROUND OF THE INVENTION

Erroneous signals can be produced in electronic circuits whenever high energy ionizing radiation, such as cosmic rays, impinge on a region of the circuit having a high electric field, such as the drain-well boundary of an MOS transistor when it is in its high impedance, or "off" state. This phenomenon, known as single event upset or SEU, is a serious problem for electronics in the high radiation environment of space. More recently, as a result of increasing circuit density, SEU has also become a problem for avionics and certain special land based applications.

Traditional circuit design methods for dealing with SEU have primarily focused on static digital logic architectures. In these architectures, SEU induced errors occur by a process of circuit interactions in which an SEU transient error changes a stored static logic "bit" to its opposite, and hence wrong, state. Methods shown in U.S. patents for mitigating SEU in static logic include circuit redundancy (U.S. Pat. Nos. 5,307,142, 5,111,429), resistive attenuation (U.S. Pat. Nos. 4,914,629, 5,525,923), delayed circuit response (U.S. Pat. Nos. 5,504,703, 4,785,200) capacitive dissipation, and high current rapid recovery. A common feature of all these methods is that they serve to mitigate static errors but do not prevent transient errors from entering the logic stream but "correct" these errors after they have occurred. In addition, most of these techniques only apply to the storage elements of the circuit (i.e., registers and memory) and do not address the transient errors being generated within the combinational logic elements (inverters and gates, or gates, etc.).

This invention can be applied to every CMOS circuit logic function (i.e., inverter, and/or mux, memory, etc.) to produce an SEU hardened equivalent circuit. It is particularly applicable to a new type of logic architecture known as "dynamic logic" which is being developed as a way to improve the speed, power, and density of digital integrated circuits. Dynamic logic achieves these through heavy use of combinational elements and few if any static storage elements. Dynamic logic operates by rapid processing and propagation of dynamically held logic states of very short duration. The duration of these states is on the same scale as the erroneous transients signals of SEU's. The traditional methods of SEU mitigation listed in the previous paragraph do not prevent transient errors from entering the logic stream. While these methods are suitable for static logic, they are not effective for dynamic logic architectures because they would defeat the power, speed, and/or density advantages of dynamic logic. Because of this, no serious attempts have been made to SEU "harden" dynamic logic and this architecture has largely been relegated to non-radiation environments. What is needed for dynamic logic is a mitigation method that prevents the SEU transients from reaching the logic stream of the circuit. The invention described herein accomplishes this with a novel MOS transistor circuit structure that isolates the source of the transient from the logic node.

This invention also has applications in analog circuits. In these circuits this technique may be applied to alter the short duration, large voltage pulse of a typical SEU signal into a longer duration, lower voltage disturbance that is more acceptable to circuit operation.

OBJECTS OF THE INVENTION

It is an object of this invention to provide a transistor circuit structure that can be used to SEU harden any type of CMOS circuit.

BRIEF SUMMARY OF THE INVENTION

This invention places an SEU immune transistor(s) between the SEU sensitive transistors of a circuit and the circuit node of those sensitive transistors are driving. It then biases the immune transistor(s) such that it will block erroneous signals when the sensitive transistors are in their SEU sensitive "off" state and pass signals whenever the sensitive transistors are in their non-SEU sensitive "on" state. Dissipation of the SEU signal is achieved with either a resistor or a second SEU immune transistor having a current drive capability that is low, so as to spread the SEU signal out over time and thus reduce the magnitude of its voltage change to an acceptable, non-disruptive level.

BRIEF DESCRIPTION OF THE SEVERAL VIEWS OF THE DRAWING

FIG. 3 is a schematic of an SEU hardened CMOS inverter as it would be configured in an SOI technology consisting of three NMOS and three PMOS transistors in which the dissipation transistors are actively biased with their gates connected to the input node and their drains connected to the well of the opposite type blocking transistor.

FIG. 4 is a physical design layout drawing of the circuit in FIG. 3.

DETAILED DESCRIPTION OF THE INVENTION

Figure 1:
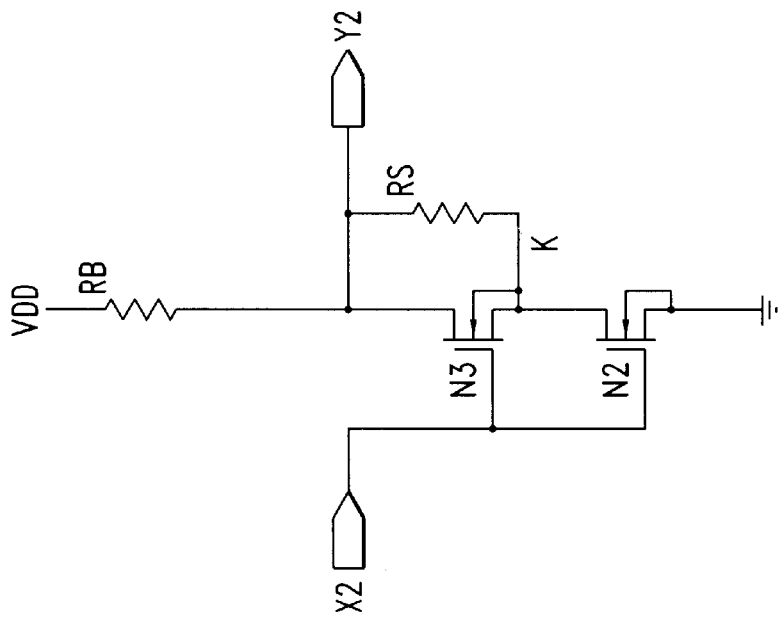
FIG. 1a is a schematic of a very simple logic inverter consisting of an NMOS transistor and a pull-up resistor.
FIG. 1b is a schematic of an SEU hardened simple inverter consisting of an NMOS transistor and a pull-up resistor, an isolated well SEU blocking transistor and an SEU dissipation resistor.
Figure 1:
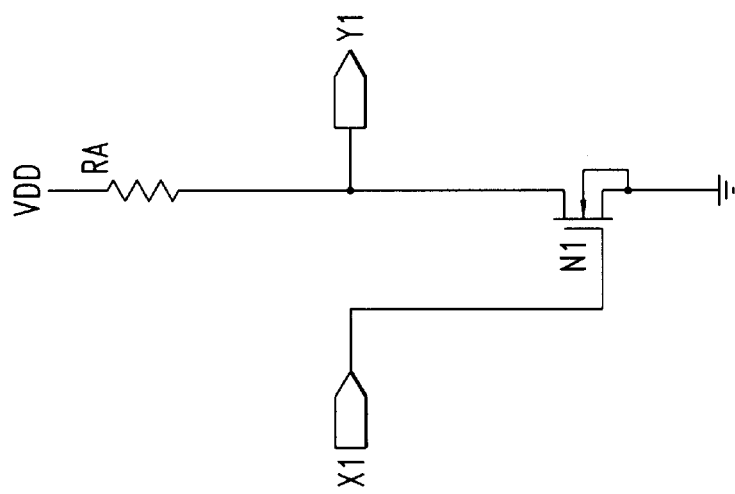

In the circuit descriptions that follow, circuit nodes which provide input signals to the circuit will be referred to as "inputs" and designated by an "X" followed by a number, i.e., X1, X2, X3, etc. Circuit nodes to which the circuit provides output signals will be referred to as "outputs" and designated by a "Y" followed by a number, i.e., Y1, Y2, Y3, etc. Use of the terms "input" and "output" in this context shall be in reference to the circuits being described and shall not be construed to exclude the use of these circuits within larger circuits in which reference the X1, X2, X3, etc. "inputs" and Y1, Y2, Y3, etc. "outputs" might not be referred to as either inputs or outputs.

A minimal circuit which contains all the most basic elements of this invention and can be used to describe its function is shown in FIG. 1b. This is a SEU hardened NMOS inverter as it would be built in a p-well process. FIG. 1a is an analogous unhardened inverter drawn for comparative description. The critical differences between these circuits are transistor N3 and resistor RS in FIG. 1b. As implied by the well-source connection for N3, this transistor would be fabricated within a p-type well separate from N2. In all SEU hardened circuits described herein the novelty of the hardening approach is that the only transistors connected to the circuit outputs are transistors within isolated wells. When the input nodes of circuits A and B are in the logic "low" state, all of the NMOS transistors are in their high impedance or "off" states and the output nodes Y1 and Y2 are held at logic "high" by conduction through resistors RA and RB. In addition, the intermediate node K of the hardened circuit B is also in a logic high state due to the shunt resistor RS. In the case of the unhardened inverter, when a high energy particle passes through the drain-well depletion region of N1, charge deposited in that region is collected by the drain of N1 at a rate far greater than the current capacity of RA. The node Y1 goes to a logic "low" state until the charge is dissipated, primarily by conduction through RA. In the case of the hardened inverter a particle hit to N2 will pull note K to a logic low but cannot pull Y2 low because transistor N3 is "off" and will not pass the signal. In addition, the resistance of RS is much greater than RA so that the dissipation of the SEU signal through RS will only cause a small voltage change on Y2 such that the logic state of Y2 will remain "high". A particle hit to transistor N3 will deposit charge but very little of this charge will be collected because, as connected in this drawing, the drain, source and well are all at the same potential leaving relatively little electric field within the transistor to drive charge collection. Most of the charge generated by particle hits to N3 will disappear by recombination, hence N3 is SEU immune. What would be necessary to upset Y2 would be two particle hits spaced within a microsecond time frame to both N2 and N3. In any real (i.e., space) environment, the mean time between such hits is on the order of years, making the probability such "simultaneous" hits infinitesimally rare. When the input nodes of these circuits go "high", transistors N1, N2, and N3 will go "on" and nodes Y1 and Y2 will go low. Being in the "on" state places all three transistors in low electric field conditions so that no SEU can occur.

Figure 2:
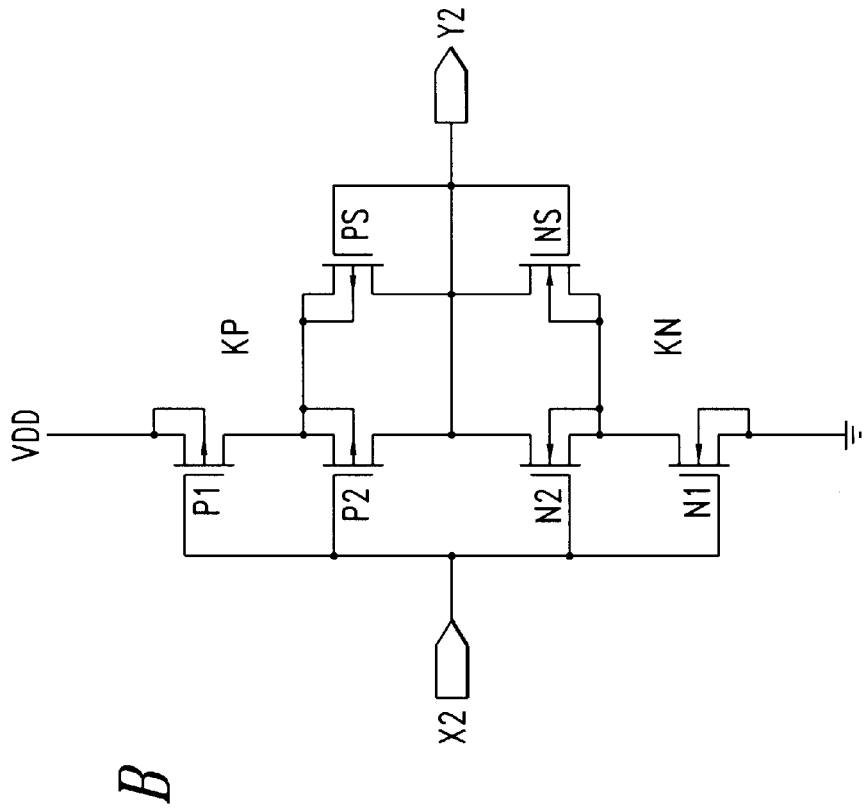
FIG. 2a is a schematic of a simple CMOS inverter consisting of one NMOS and one PMOS transistor.
FIG. 2b is a schematic of an SEU hardened CMOS inverter as it would be configured in a silicon-on-insulator (SOI) CMOS technology consisting of three NMOS and three PMOS transistors in which the dissipation transistors are passively biased with the gate and drain in common.
Figure 2:
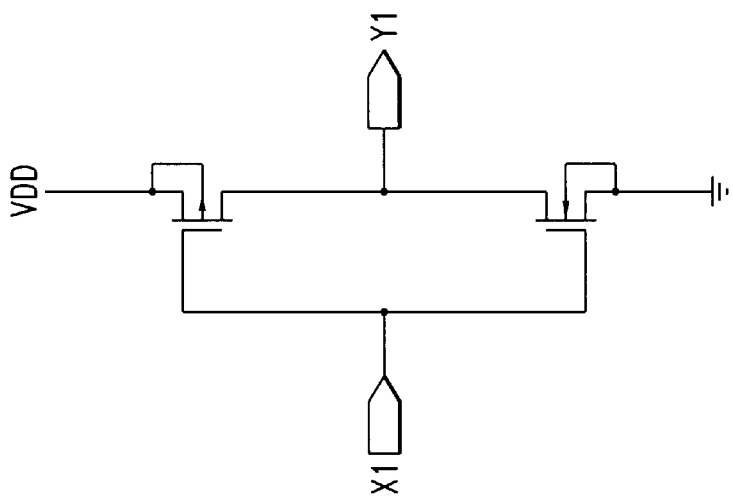

The circuits in FIG. 1 represent a simple implementation of this invention but the resistors shown in these circuits are not typical used in CMOS technologies. FIG. 2 represents a more typical example of how this invention would be used to build an SEU hardened CMOS inverter circuit. FIG. 2a is a schematic of a standard unhardened CMOS inverter. FIG. 2b is a CMOS inverter as it could be hardened by this invention and fabricated in a process such as silicon on insulator (SOI) in which both n and p-type wells can be isolated. The shunt resistor RS of FIG. 1b has been replaced by a small "pull-up" shunt transistor NS that has both its drain and gate connected to Y2 (a more common and practical implementation for pull-ups than resistors). Transistor NS is placed within the same isolated p-well as transistor N2 so that both will be SEU immune. The resistor RA has been replaced by the PMOS complement transistors P1, P2 and PS. Transistors P2 and PS are placed within a common isolated n-well so that they are also both SEU immune. The function of this circuit 2b is the same as FIG. 1b with the obvious power, speed and density advantages of CMOS. Again, the critical features of this circuit are the isolated well transistors N2, NS, P2 and PS placed between the main drive transistors N1 and P1 and the output node Y2 with their source, drain and well regions held at very nearly the same potential to render them SEU immune.

FIG. 3 is a faster and more SEU robust variant of FIG. 2b in which the "pull-up" transistor PS and "pull-down" NS have been reconnected as active transistors with their gates connected to X1 and their drains connected to the source well nodes of N2 and P2, respectively. These active transistors switch nodes KP and KN more quickly and maintain a more uniform field across transistors P2 and N2 than the passive transistors of FIG. 2b.

FIG. 4 is a representative layout drawing of the circuit schematic in FIG. 3 showing the separate n-well surrounding P2 and PS, and the separate p-well surrounding N2 and NS.

Figure 5:
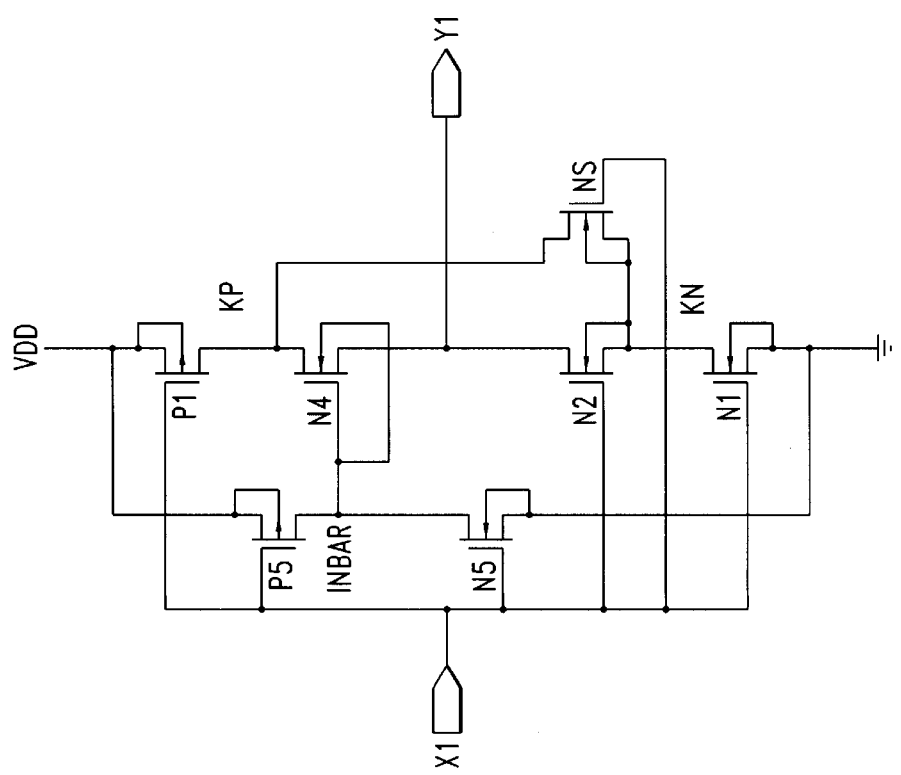
FIG. 5 is a schematic of an SEU hardened CMOS inverter as it would be configured in a bulk n-well technology.

FIG. 5 is a schematic showing how this technique is accomplished in a p-well bulk process in which isolated n-wells are not available and therefore PMOS transistors cannot be made SEU immune. In this case, isolation of Y1 is accomplished entirely with isolated p-well, NMOS transistors. An additional inverter consisting of transistors P5 and N5 is added to provide the proper logic states to the gate of N4 so that it will be "off" when P1 is SEU sensitive, and to the well of N4 because this connection provides a lower electric field in N4 when it is "off". Also, since only immune NMOS transistors are available to shunt current between KP and KN, a single passive NMOS pull-up shunt transistor NS is used.

Figure 6:
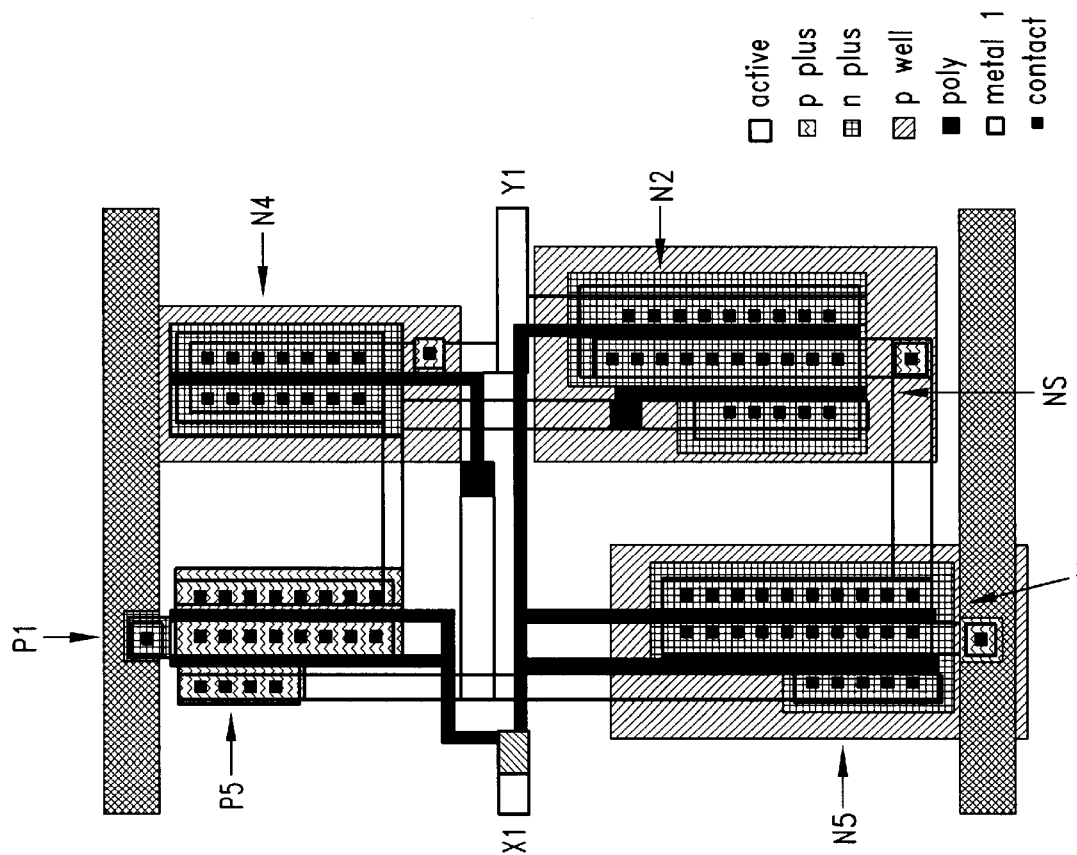
FIG. 6 is a physical design layout drawing of the circuit in FIG. 5.

FIG. 6 is a representative layout drawing of the circuit schematic in FIG. 5 showing the separate p-well surrounding N4, and a separate p-well surrounding N2 and NS.

Figure 7:
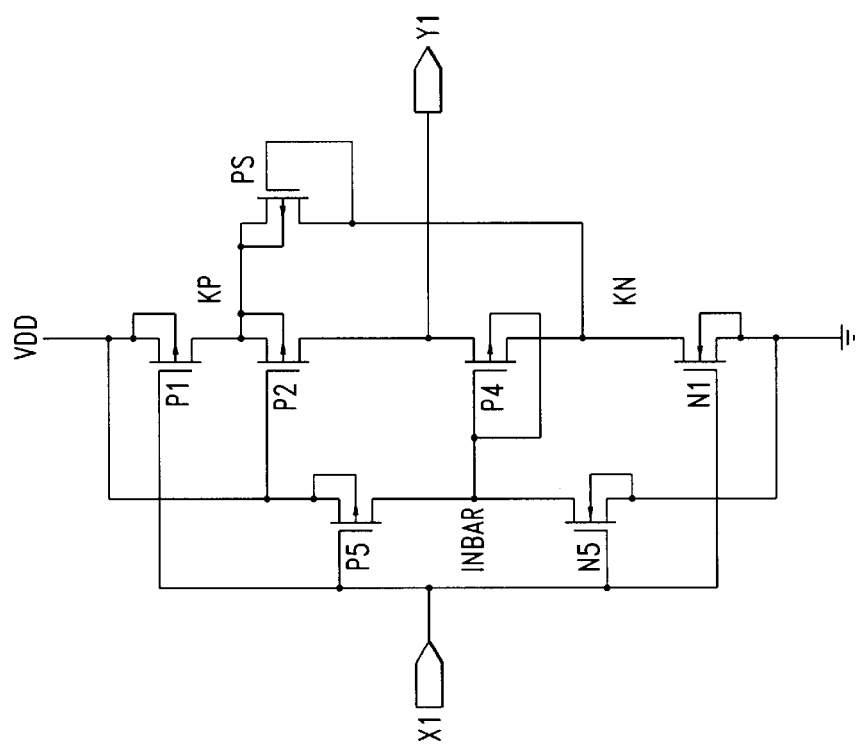
FIG. 7 is a schematic of an SEU hardened CMOS inverter as it would be configured in a bulk p-well technology.

FIG. 7 is a schematic of this technique analogous to FIG. 5 but in this instance implemented in an n-well bulk process.

Figure 8:
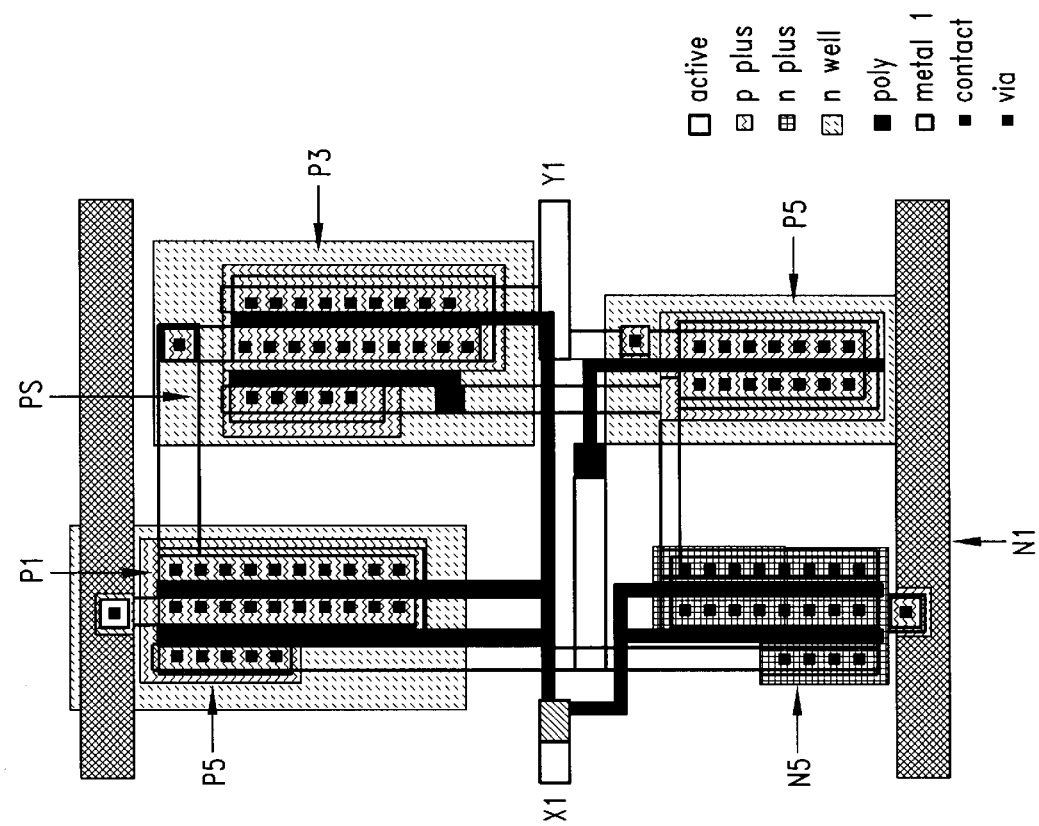
FIG. 8 is a physical design layout drawing of the circuit in FIG. 7.

FIG. 8 is a representative layout drawing of the circuit schematic in FIG. 7 showing the separate n-well surrounding P4, and separate n-well surrounding P2 and PS.

Figure 9:
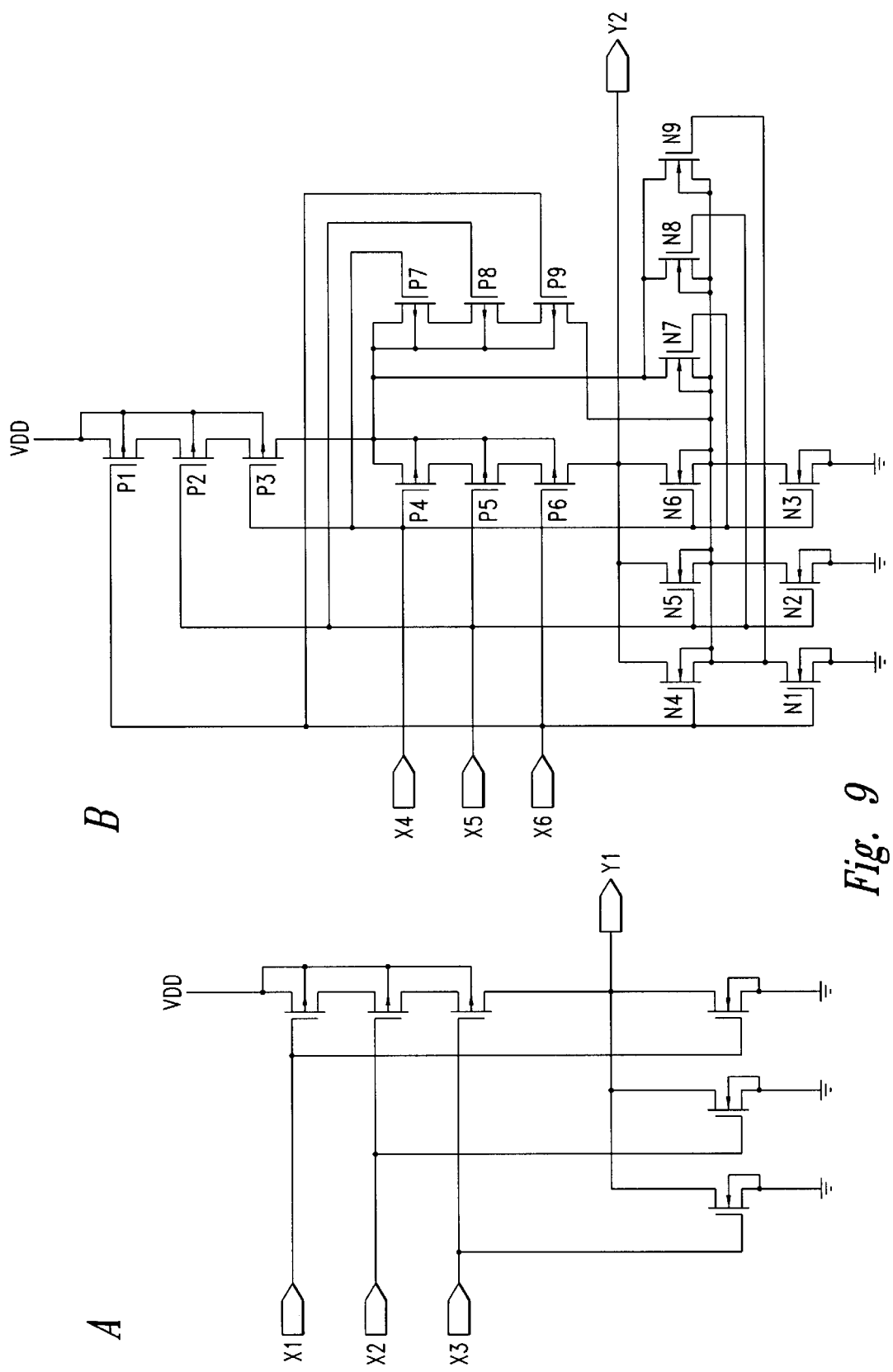
FIG. 9 is a pair of schematics showing implementation of an SEU hardened nor gate as it would be configured in an SOI technology.

FIG. 9a shows a schematic drawing of a standard three input nor gate as it would be designed in a CMOS technology. FIG. 9b shows how this invention could be applied to SEU harden the same nor gate in an SOI CMOS technology. In FIG. 9b the NMOS transistors are simply three instances of the NMOS configuration of FIG. 3 connected with sources and drains in parallel and the SEU immune transistors N4, N5, N6, N7, NS and N9 all placed within a common isolated p-well. The PMOS configuration in FIG. 9b has the SEU signal blocking transistors P4, P5 and P6 connected in series and the shunt transistors P7, P8 and P9 connected in series. The gates of the blocking and shunt transistors are connected to the nor gate inputs to achieve proper biasing.

Figure 10:
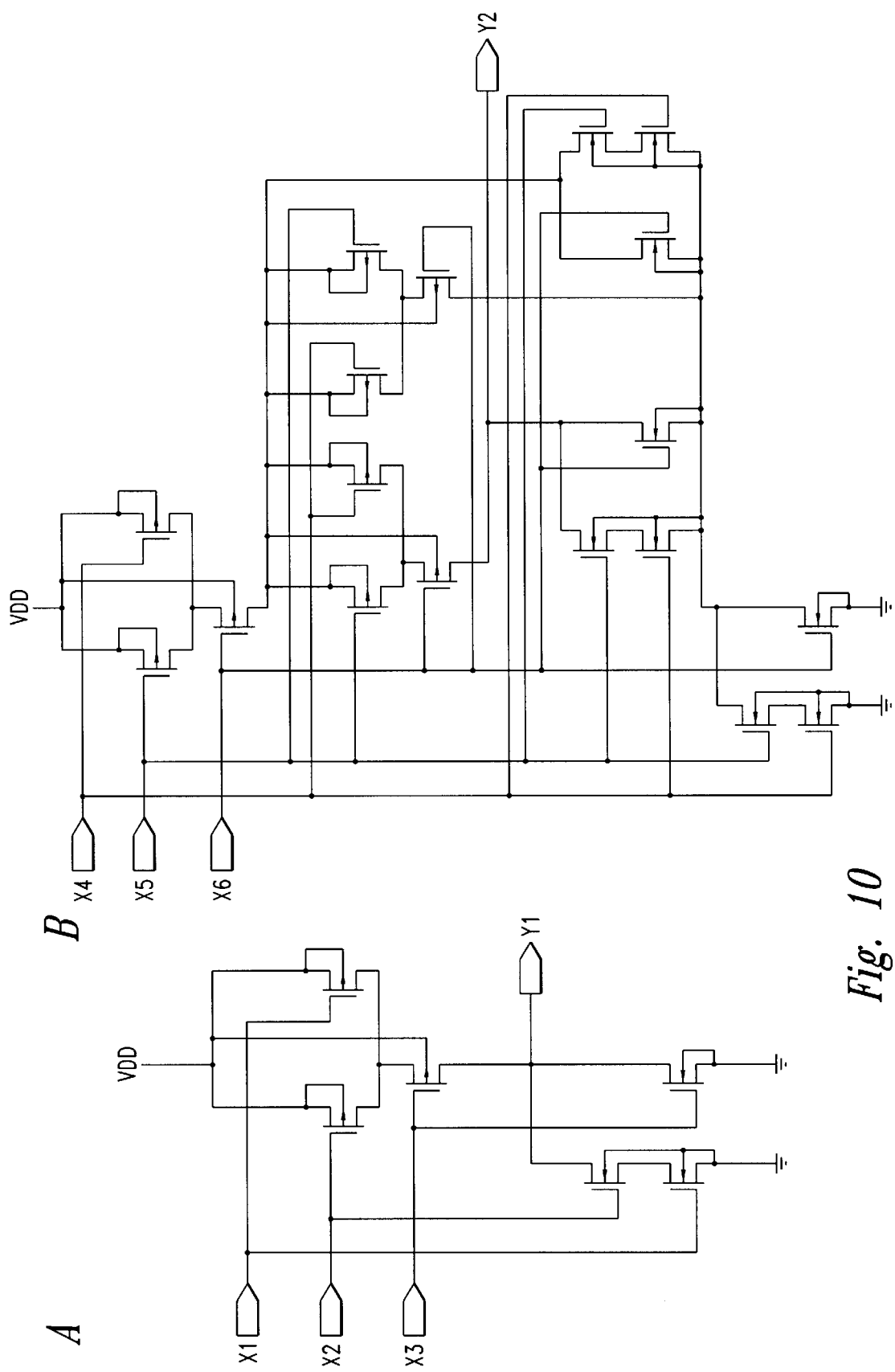
FIG. 10 is a pair of schematics showing implementation of an SEU hardened "aoi" gate as it would be configured in an SOI technology.

FIG. 10a shows a schematic of a gate known as an "aoi". FIG. 10b is its hardened equivalent. Note that in this case the blocking transistors within each isolated well are connected in a combination of both series and parallel configurations.

Figure 11:
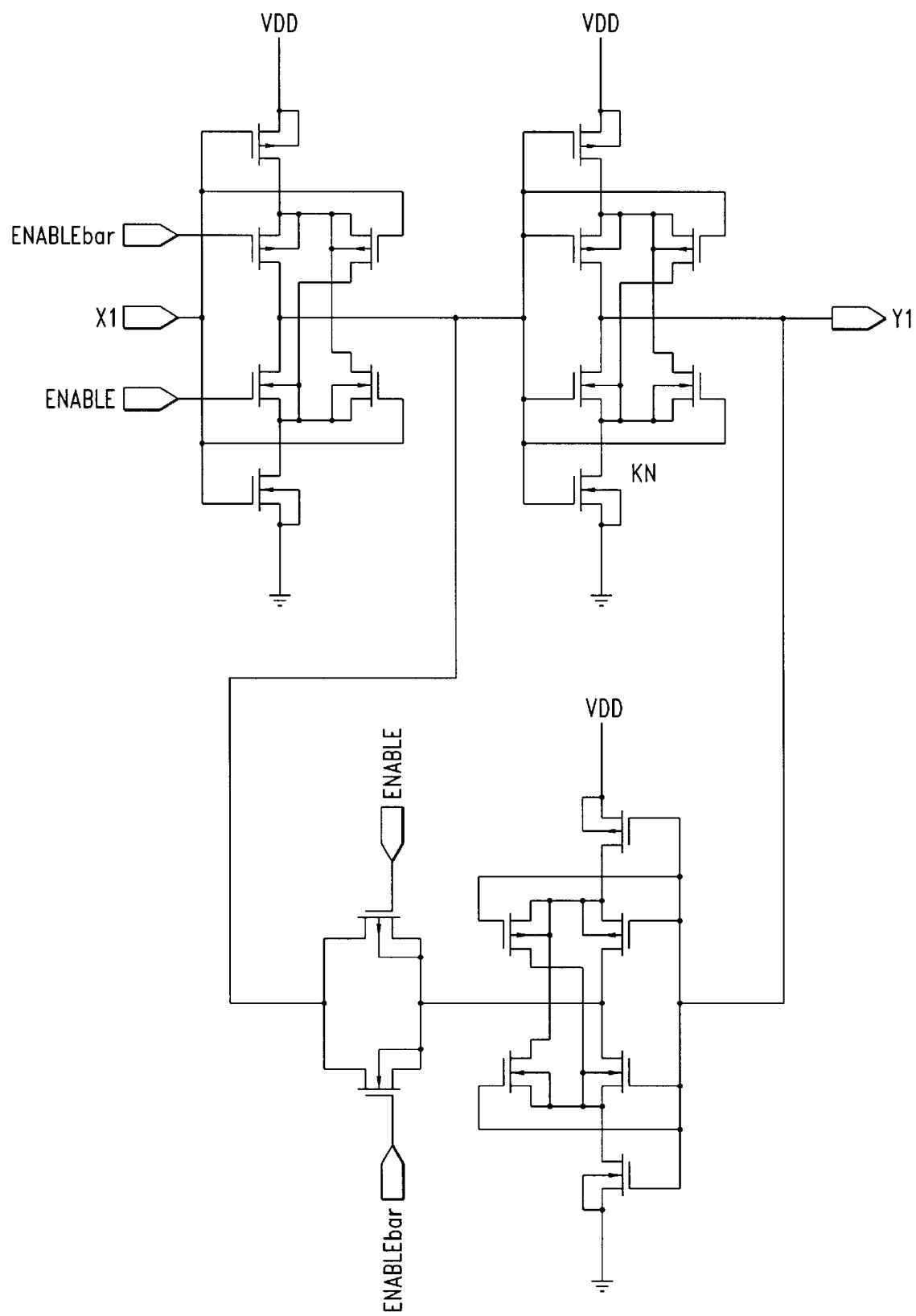
FIG. 11 is a schematic of an SEU hardened storage element as it would be configured in an SOI technology.

FIG. 11 is a schematic showing how this invention could be used in internal circuit elements to create a hardened latch.

What is claimed is:

1. An SEU signal blocking and dissipation subciruit comprised of:
   (a) a blocking subciruit using transistors that are entirely of type PMOS which are all contained within a single n-well, said blocking subcircuit having one external source node which is connected to the n-well and sources of one or more of the subcircuit's transistors, one external drain node which is connected to one or more drains of the subcircuit's transistors, and a set of external gate nodes connected to the subcircuit's transistor gates and having bias applied to the external gate nodes such that whenever any circuit connected to the blocking subcircuit's external source node is in an SEU sensitive state, the current path(s) through the blocking subcircuit from the external source node to the external drain node will be in a high impedance (off) state; and
   (b) a shunt subcircuit connected between the blocking subcircuit's external source node and another circuit node which has a static bias potential with respect to the blocking subcircuit's external drain node the magnitude of which is less than 40% of the potential from the supply voltage to ground and said shunt subcircuit having a current capability which is less than 50% of any low impedance circuit path from the blocking subcircuit's external drain node to the negative circuit power supply or ground.

2. An SEU signal blocking and dissipation subcircuit comprised of:
   (a) a blocking subcircuit using transistors that are entirely of type NMOS which are all contained within a single p-well, said blocking subcircuit having one external source node which is connected to the p-well and sources of one or more of the subcircuit's transistors, one external drain node which is connected to one or more drains of the subcircuit's transistors, and a set of external gate nodes connected to the subcircuit's transistor gates and having bias applied to the external gate nodes such that whenever any circuit connected to the blocking subcircuit's external source node is in an SEU sensitive state, the current path(s) through the blocking subcircuit from the external source node to the external drain node will be in a high impedance (off) state; and
   (b) a shunt subcircuit connected between the blocking subcircuit's external source node and another circuit node which has a static bias potential with respect to the blocking subcircuit's external drain node the magnitude of which is less than 40% of the potential from the supply voltage to ground and said shunt subcircuit having a current capability which is less than 50% of any low impedance circuit path from the blocking subcircuit's external drain node to the positive circuit power supply or Vdd.

3. An SEU signal blocking and dissipation subcircuit comprised of:
   (a) a blocking subcircuit using transistors that are entirely of type NMOS which are all contained within a single p-well, said blocking subcircuit having one external source node which is connected to the sources of one or more of the subcircuit's transistors, one external drain node which is connected to one or more drains of the subcircuit's transistors, an external p-well node connected to the common p-well, and a set of external gate nodes connected to the subcircuit's transistor gates and having bias applied to the p-well node such that the blocking subcircuit's p-well is at a potential with respect to the blocking subcircuit's external source node the magnitude of which is less than 40% of the potential from the supply voltage to ground and having bias applied to said blocking subcircuit's external gate nodes such that whenever any circuit connected to the blocking subcircuit's external drain node is in an SEU sensitive state, the current path(s) through the blocking subcircuit from the external drain node to the external source node will be in a high impedance (off) state; and
   (b) a shunt subcircuit connected between the blocking subcircuit's external drain node and another circuit node which has a static bias potential with respect to the blocking subcircuit's external source node the magnitude of which is less than 40% of the potential from the supply voltage to ground and said shunt subcircuit having a current capability which is less than 50% of any low impedance circuit path from the blocking subcircuit's external source node to the negative circuit power supply or ground.

4. An SEU signal blocking and dissipation subcircuit comprised of:
   (a) a blocking subcircuit using transistors that are entirely of type PMOS which are all contained within a single n-well, said blocking subcircuit having one external source node which is connected to the sources of one or more of the subcircuit's transistors, one external drain node which is connected to one or more drains of the subcircuit's transistors, an external n-well node connected to the common n-well, and a set of external gate nodes connected to the subcircuit's transistor gates and having bias applied to the blocking subcircuit's n-well node such that the n-well is at a potential with respect to the blocking subcircuit's external source node the magnitude of which is less than 40% of the potential from the supply voltage to ground and having bias applied to said blocking subcircuit's external gate nodes such that whenever any circuit connected to the blocking subcircuit's external drain node is in an SEU sensitive state, the current path(s) through the blocking subcircuit from the external drain node to the external source node will be in a high impedance (off) state; and
   (b) a shunt subcircuit connected between the blocking subcircuit's external drain node and another circuit node which has a static bias potential with respect to the blocking subcircuit's external source node the magnitude of which is less then 40% of the potential from the supply voltage to ground and said shunt subcircuit having a current capability which is less than 50% of any low impedance circuit path from the blocking subcircuit's external source node to the positive circuit power supply or Vdd.

5. A circuit comprising in combination:
   (a) a plurality of single event upset (SEU) sensitive transistors;
   (b) a circuit node driven by said plurality of single event upset (SEU) sensitive transistors;
   (c) at least one single event (SEU) immune transistor disposed between said single event upset (SEU) sensitive transistors and said circuit node driven by said plurality of single event (SEU) sensitive transistors;
   (d) and with bias being supplied to the single event upset (SEU) immune transistor(s) such that it is in a high impedance state at any time that bias to said plurality of single event upset (SEU) sensitive transistors places any of said plurality of single event upset (SEU) sensitive transistors in a single event upset (SEU) sensitive state.

6. A single event upset (SEU) hardened circuit comprising in combination:
   (a) a plurality of transistors connected to a plurality of output logic nodes; and
   (b) said plurality of transistors connected to said plurality of output nodes comprise transistors within isolated wells having no gate, drain, source, or well node of said plurality of transistor connected in common with VDD or VSS.

7. An isolated well transistor circuit which has neither drain, source, gate, nor well nodes connected in common with either VDD or VSS for mitigation of single event upsets comprising dynamic logic which hardens the logic to corruption from transients causes by charged particle radiation.

* * * * *